United States Patent [19]
Grishakov et al.

[11] Patent Number: 5,734,271
[45] Date of Patent: Mar. 31, 1998

[54] WIDEBAND POWER DRIVER WITH SEPARATE SETTING DELAYS OF LEADING AND TRAILING EDGES

[75] Inventors: Gennady Ivanovich Grishakov; Igor Vladimirovich Tarasov, both of Moscow, Russian Federation

[73] Assignee: Sun Microsystems, Inc., Mountain View, Calif.

[21] Appl. No.: 639,992

[22] Filed: Apr. 26, 1996

[51] Int. Cl.$^6$ .................... H03K 17/16; H03K 19/0175

[52] U.S. Cl. .................... 326/26; 326/27; 326/83

[58] Field of Search .................... 326/26, 27, 83

[56] References Cited

U.S. PATENT DOCUMENTS

| | | | |
|---|---|---|---|
| 5,063,308 | 11/1991 | Borkar | 326/26 |
| 5,559,452 | 9/1996 | Saito | 326/27 |
| 5,572,146 | 11/1996 | Ahn et al. | 326/26 |
| 5,654,648 | 8/1997 | Medhekar et al. | 326/27 |

Primary Examiner—Edward P. Westin
Assistant Examiner—Richard Roseen
Attorney, Agent, or Firm—D'Alessandro & Ritchie

[57] ABSTRACT

A wideband power driver having separate settings to delay a falling edge and rising edge of an output signal according to the present invention comprises an input node for receiving input signals and an output node for supplying output signals. A pulldown circuit is connected between the output node and a first supply voltage potential, the pulldown circuit having an input. A pullup circuit is connected between the output node and a second supply voltage potential, the pullup circuit having an input. A leakage current circuit is connected between the output node and the second supply voltage potential. A NOR gate has a first input, a second input connected to the input node, and an output. A first non-inverting delay element has an input connected to the output node and an output connected to the first input of said NOR gate. An inverting delay element has an input connected to the output of the NOR gate and an output connected to the input of the pullup circuit, and the inverting delay element is selected to provide a delay of the rising edge of the output signal. A second non-inverting delay element has an input connected to the input node and an output connected to the input of the pulldown circuit, and the second non-inverting delay element is selected to provide a delay of the falling edge of the output signal.

32 Claims, 2 Drawing Sheets

WIDEBAND POWER DRIVER WITH SEPARATE SETTING DELAYS OF LEADING AND TRAILING EDGES

BACKGROUND OF THE INVENTION

1. Field of the Invention

The present invention relates to wideband power drivers. More particularly, the present invention relates to wideband power drivers having separate settings to delay a failing edge and rising edge of an output signal for driving high-capacitance loads.

2. The Prior Art

To obtain and reproduce control and strobe pulses with short leading and trailing edges for driving high-capacitance loads, chains of scaled inverters having a small fan-out factor (2–3) are normally used as wideband power drivers. The application of such drivers is illustrated in the following example. The leading edge of a write (or read) enable strobe pulse connects a memory cell (sense amplifier) to bit and reference lines (or to two differential bit lines). This connection creates a potential or current difference between the inner nodes of the memory cell (sense amplifier). This process should be finished after the trailing edge of the strobe pulse appears, and the precharge of buses capacitance is then initiated. To achieve a correct and more reliable operation of memory cells and sense amplifiers, it is desirable that wideband power drivers provide: (1) the shortest possible delay and length of a trailing edge of the output pulse, and (2) a sufficiently short leading edge of the output pulse. However, present wideband power drivers are unable to obtain an extremely small delay of either the leading or trailing edge of the output pulse, due to the charge and discharge of the high-capacitance of P-Channel transistors in the chains of scaled inverters. Such wideband power drivers are also unable to separately delay the leading and trailing edges of the output pulse, while maintaining a wide bandpass of the output pulse.

BRIEF DESCRIPTION OF THE INVENTION

A wideband power driver having separate settings to delay a falling edge and rising edge of an output signal according to the present invention comprises an input node for receiving input signals and an output node for supplying output signals. A pulldown circuit is connected between the output node and a first supply voltage potential, the pulldown circuit having an input. A pullup circuit is connected between the output node and a second supply voltage potential, the pullup circuit having an input. A leakage current circuit is connected between the output node and the second supply voltage potential. A NOR gate has a first input, a second input connected to the input node, and an output. A first non-inverting delay element has an input connected to the output node and an output connected to the first input of said NOR gate. An inverting delay element has an input connected to the output of the NOR gate and an output connected to the input of the pullup circuit, and the inverting delay element is selected to provide a delay of the rising edge of the output signal. A second non-inverting delay element has an input connected to the input node and an output connected to the input of the pulldown circuit, and the second non-inverting delay element is selected to provide a delay of the falling edge of the output signal.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
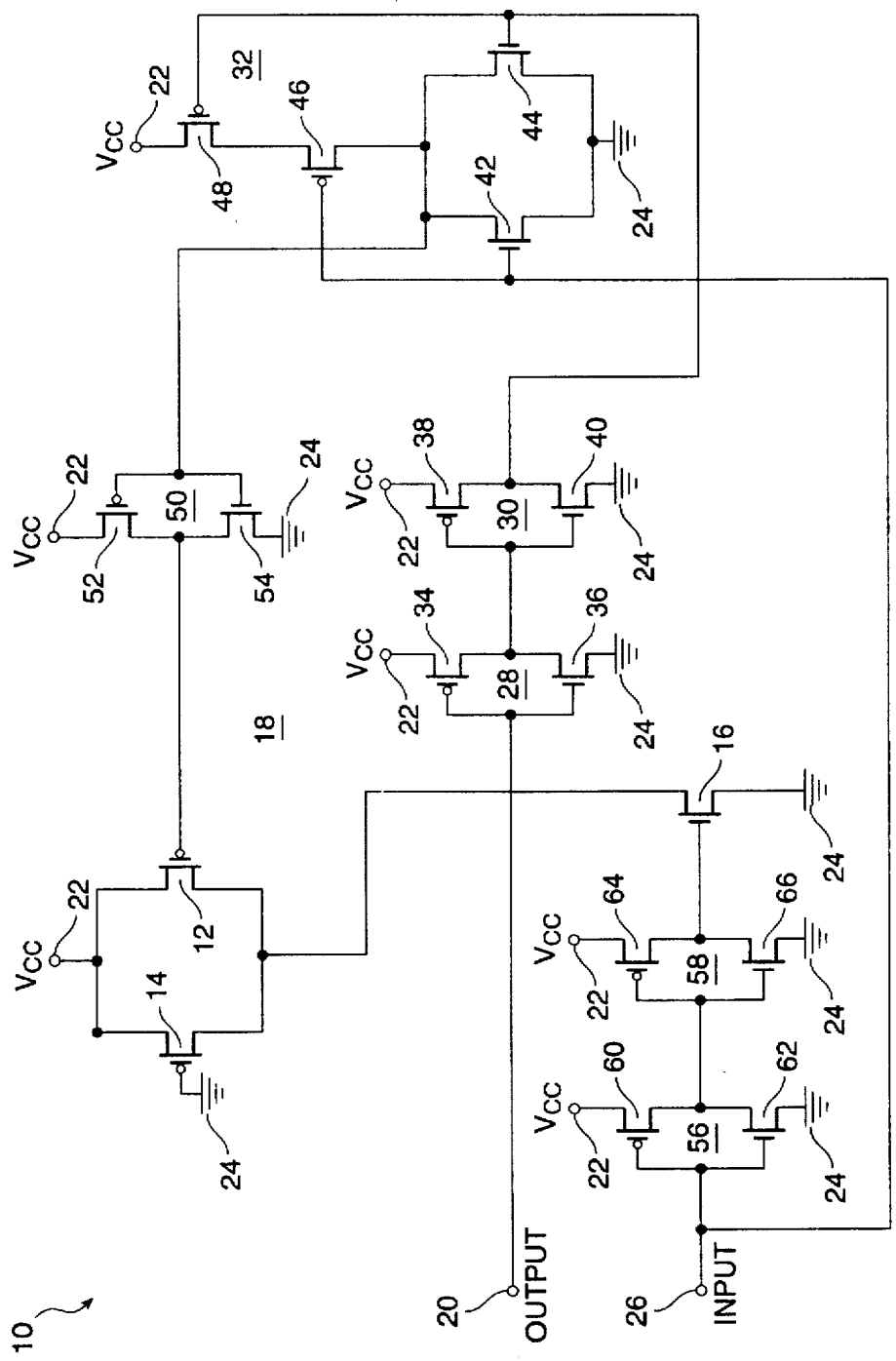
FIG. 1 is schematic diagram of a presently preferred embodiment of a wideband power driver having separate settings to delay the leading and trailing edges of an output signal, according to the present invention.

Referring first to FIG. 1, a wideband power driver with separate setting delays of leading and trailing edges is depicted in schematic diagram form. Driver circuitry 10 is seen to comprise a P-Channel pullup transistor 12, P-Channel leakage transistor 14, N-Channel pulldown transistor 16, and feedback circuit 18 connected between driver output node 20 and the gate of P-Channel pullup transistor 12. The sources of P-Channel pullup transistor 12 and P-Channel leakage transistor 14 are connected to a first supply voltage node 22 for supplying a positive voltage potential, and the drains of P-Channel pullup transistor 12 and P-Channel leakage transistor 14 are connected to driver output signal node 20. The gate of P-Channel leakage transistor 14 is connected to a second supply voltage node 24 for supplying a potential such as ground.

N-Channel pulldown transistor 16 has a gate which may either connected through inverters 56 and 58 as shown, or may instead be connected directly to driver input signal node 26, a drain connected to driver output signal node 20, and a source connected to second supply voltage node 24.

Feedback circuit 18 is seen to comprise a pair of inverters 28 and 30, a logic NOR circuit 32, and an odd number of cascaded inverters connected between logic NOR circuit 32 and P-Channel pullup transistor 12. Inverter 28 includes a first P-Channel inverter transistor 34 and a first N-Channel inverter transistor 36, and inverter 30 includes a second P-Channel inverter transistor 38 and a second N-Channel inverter transistor 40. The gates of first P-Channel inverter transistor 34 and first N-Channel inverter transistor 36 are connected to driver output signal node 20. The drains of first P-Channel inverter transistor 34 and first N-Channel inverter transistor 36 are connected to the gates of second P-Channel inverter transistor 38 and second N-Channel inverter transistor 40. The sources of P-Channel inverter transistors 34 and 38 are connected to first supply voltage node 22, and the sources of N-Channel inverter transistor 36 and 40 are connected to second supply voltage node 24.

Logic NOR circuit 32 includes a pair of N-Channel switching transistors 42 and 44 and a pair of P-Channel switching transistors 46 and 48. The sources of N-Channel switching transistors 42 and 44 are connected to second supply voltage node 24. The gates of N-Channel switching transistor 42 and P-Channel switching transistor 46 are connected to driver input signal node 26, and the gates of N-Channel switching transistor 44 and P-Channel switching transistor 48 are connected to the drains of second P-Channel inverter transistor 38 and second N-Channel inverter transistor 40. The source of P-Channel switching transistor 48 is connected to first supply voltage node 22. The drain of P-Channel switching transistor 48 is connected to the source of P-Channel switching transistor 46.

Those of ordinary skill in the art will recognize that an odd number of cascaded inverters can be connected between the output of logic NOR circuit 32 and the input of P-Channel pullup transistor 12. In the embodiment disclosed in FIG. 1, the odd number of cascaded inverters connected between logic NOR circuit 32 and P-Channel pullup transistor 12 is shown as inverter 50.

Inverter 50 further includes P-Channel inverter transistor 52 and N-Channel inverter transistor 54. The source of P-Channel inverter transistor 52 is connected to first supply voltage node 22, and the source of N-Channel inverter transistor 54 is connected to second supply voltage node 24. The gates of P-Channel inverter transistor 52 and N-Channel inverter transistor 54 are connected to the drains of N-Channel switching transistors 42 and 44 and P-Channel switching transistor 46. The drains of P-Channel inverter transistor 52 and N-Channel inverter transistor 54 are connected to the gate of P-Channel pullup transistor 12.

As an option, inverter pairs 56 and 58 may be connected between input node 26 and the gate of N-Channel pulldown transistor 16 to delay the falling edge of the output pulse. Inverter 56 includes P-Channel inverter transistor 60 and N-Channel inverter transistor 62, and inverter 58 includes P-Channel inverter transistor 64 and N-Channel inverter transistor 66.

There are two conditions to consider when analyzing the operation of driver circuitry 10 of the present invention. The first is the condition when a positive-going input signal pulse is applied to the driver circuitry, and the second is the condition when a negative-going input signal pulse is applied to the driver circuitry.

Figure 2:
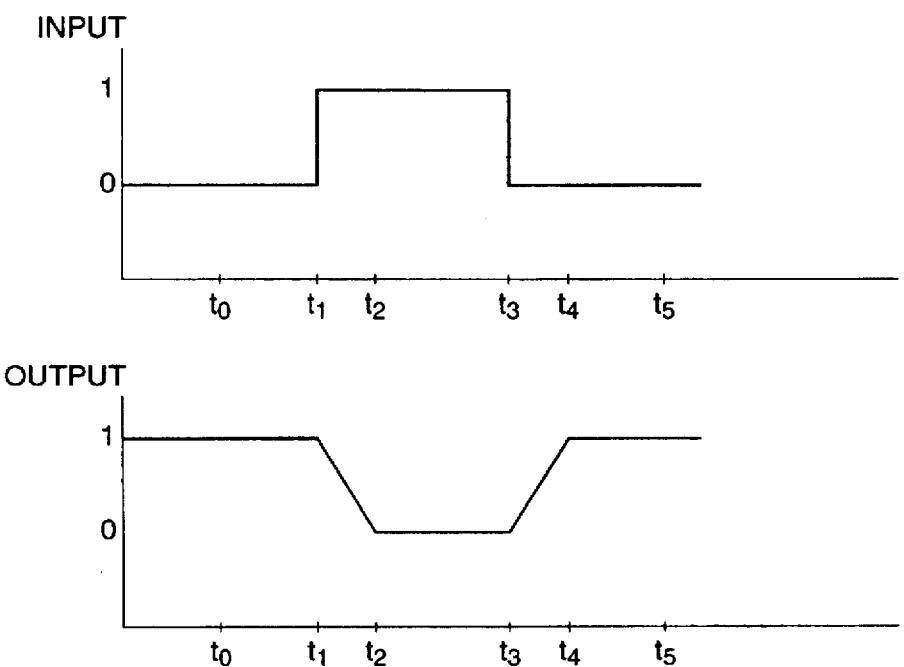
FIG. 2 is a timing diagram of the operation of the circuit of FIG. 1 upon the application of a positive-going input signal pulse.

Referring now to FIG. 2, a timing diagram will be useful when analyzing the operation of driver circuit 10 when a positive-going pulse is driven into input node 26. During an initial steady state time period t0 when the input signal to input node 26 is at a low logic level, N-Channel pulldown transistor 16 is switched off, since the low logic level input signal is being driven into the gate of N-Channel pulldown transistor 16. The low logic level input signal is also being driven into the second input of logic NOR circuit 32.

During this same steady state time period t0, P-Channel leakage transistor 14 provides a leakage current for charging the capacitance load at output node 20 to a high logic level voltage. P-channel leakage transistor 14 is a small device which may be easily overcome by N-Channel pulldown transistor 16. In addition, P-Channel leakage transistor 14 is small in comparison to P-Channel pullup transistor 12. For example, the channel width of P-Channel leakage transistor 14 may be about 3 microns, while the channel widths of P-Channel pullup transistor 12 and N-Channel pulldown transistor 16 may be about 200 microns and 100 microns, respectively.

During t0, output node 20 is driving its high logic level signal into the first input of logic NOR circuit 32, via inverters 28 and 30. The output signal of inverter 30 is at a high logic level at t0, since it has passed through inverters pair 28 and 30. The high logic level output of inverter 30 is being driven into the first input of logic NOR circuit 32.

Logic NOR circuit 32 has a low logic level output during t0, since a high logic level signal is being driven into its first input and a low logic level signal is being driven into its second input. Logic NOR circuit 32 will then drive its low logic level output signal into the input of inverter 50. The signal at the output of inverter 50 and input of P-Channel pullup transistor 12 is at a high logic level. Since a high logic level signal is being driven into the gate of P-Channel pullup transistor 12, transistor 12 is switched off during the t0 initial steady state period.

During a subsequent time period t1 occurring after initial steady state time period t0, a high logic level signal may be driven into input node 26 (see FIG. 2). This high logic level signal switches on N-Channel pulldown transistor 16. Since N-Channel pulldown transistor 16 is switched on during t1, current conductance can occur from output node 20 to second supply voltage node 24 (ground in FIG. 1), via N-Channel pulldown transistor 16. At t1, current is discharged through N-Channel pulldown transistor 16 from the capacitance load at output node 20. The capacitance load current discharge through N-Channel pulldown transistor 16 causes the voltage at output node 20 to decrease to a low logic level at a time period (t2) occurring after the signal at input node 26 switches from a low logic level to a high logic level.

The capacitance load discharge generates the falling edge of the negative output pulse generated at output node 20. Those of ordinary skill in the art will recognize that the capacitance load discharge can be delayed at various time periods occurring subsequent to t1. The delay of the capacitance load discharge is achieved by connecting optional inverter pairs between input node 26 and the gate of N-Channel pulldown transistor 16. If the optional inverter pairs 56 and 58 are utilized, then N-Channel pulldown transistor 16 will not immediately turn on after the input signal at input node 26 switches from a low logic level to a high logic level. As an example, if four cascaded inverters are connected between input node 26 and the gate of N-Channel pulldown transistor 16, then the capacitance load discharge will occur four inverter delays after the input signal at input node 26 switches from a low logic level to a high logic level.

The high logic level signal driven into input node 26 during t1 is also driven into the second input of logic NOR circuit 32. The signal being driven into the first input of logic NOR circuit 32 remains at a high logic level during t1, since the signal driven by output node 20 into the first input of logic NOR circuit 32 is delayed by inverters pair 28 and 30.

Logic NOR circuit 32 maintains a low logic level output during t1, since a high logic level signal is being driven into its first input and second input. Logic NOR circuit 32 continues to drive its low logic level output signal into the input of inverter 50. One inverter delay after t1, the signal at the output of inverter 50 and the gate of P-Channel pullup transistor 12 remains at a high logic level. Since a high logic level signal continues to be driven into the gate of P-Channel pullup transistor 12, transistor 12 remains switched off one inverter delay after t1.

During t2, the voltage at output node 20 would have switched to a low logic level. The signal driven into input node 26 and the second input of logic NOR circuit 32 remains at a high logic level. The signal driven into the first input of logic NOR circuit 32 remains at a high logic level, since the low logic level signal driven by output node 20 into the first input of logic NOR circuit 32 is delayed by inverters pair 28 and 30.

Logic NOR circuit 32 maintains a low logic level output during t2, since a high logic level signal is being driven into its first input and second input. Logic NOR circuit 32 continues to drive its low logic level output signal into the input of inverter 50. One inverter delay after t2, the signal at the output of inverter 50 and the gate of P-Channel pullup transistor 12 remains at a high logic level. Since a high logic level signal continues to be driven into the gate of P-Channel pullup transistor 12, transistor 12 remains switched off one inverter delay after t2.

Two inverter delays after t2, the low logic level signal driven by output node 20 would have reached the output of inverter 30 and the first input of logic NOR circuit 32 as a low logic level signal. Logic NOR circuit 32 maintains a low logic level output, since a low logic level signal is being driven into its first input and a high logic level signal is being driven into its second input. The signal at the output of inverter 50 and gate of P-Channel pullup transistor 12 remains at a high logic level. Therefore, P-Channel pullup transistor 12 remains switched off at three inverter delays after t2.

During a subsequent time period t3, the high logic level signal at input node 26 may switch to a low logic level signal (see FIG. 2). This low logic level signal switches off N-Channel pulldown transistor 16, thereby forming an open circuit between output node 20 and second supply voltage node 24.

The low logic level signal driven into input node 26 during t3 is also driven into the second input of logic NOR circuit 32. The signal being driven into the first input of logic NOR circuit 32 remains at a low logic level during t3, since the signal driven by output node 20 into the first input of logic NOR circuit 32 is delayed by inverters pair 28 and 30.

During t3, logic NOR circuit 32 switches its output from a low logic level to a high logic level, since a low logic level signal is being driven into its first input and second input. Logic NOR circuit 32 will then drive its high logic level output signal into the input of inverter 50. One inverter delay after t3, the signal at the output of inverter 50 and gate of P-Channel pullup transistor 12 is at a low logic level. One inverter delay after t3, P-Channel pullup transistor 12 turns on, since a low logic level signal is driven into its gate.

Note that at t3, when N-Channel pulldown transistor 16 is turned off, the voltage at output node 20 does not immediately rise to a high logic level. P-Channel leakage transistor 14 is a small device and can only provide a leakage current. By itself it is unable to instantaneously charge the capacitance load at output node 20 to a high logic level. After P-Channel pullup transistor 12 switches on one inverter delay after t3, the capacitance load at output node 20 is rapidly charged to a high logic level by P-Channel pullup transistor 12. At a subsequent time t4, the capacitance load at output node 20 is fully charged to a high logic level.

The rapid charging of the capacitance load generates the rising edge of the negative output pulse generated at output node 20. Those of ordinary skill in the art will recognize that the charging of the capacitance load can be delayed at various time periods occurring after the output of logic NOR circuit 32 switches from a low logic level to a high logic level. The delay of the charging of the capacitance load is achieved by connecting additional inverter pairs in series with inverter 50. By connecting the additional inverter pairs, P-Channel pullup transistor 12 will not immediately turn on at one inverter delay after the output signal of logic NOR circuit 32 switches from a low logic level to a high logic level. As an example, if five cascaded inverters are connected between the output of logic NOR circuit 32 and the gate of P-Channel pullup transistor 12, then the charging of the capacitance load will occur five inverter delays after the output signal of logic NOR circuit 32 switches from a low logic level to a high logic level.

At t4, the input signal driven into input node 26 and the second input of logic NOR circuit 32 remains at a low logic level. The signal driven into the first input of logic NOR circuit 32 remains at a low logic level, since the high logic level signal driven by output node 20 is delayed by inverters pair 28 and 30.

Logic NOR circuit 32 maintains a high logic level output during t4, since a low logic level signal is being driven into its first input and second input. Logic NOR circuit 32 will continue driving its high logic level output signal into the input of inverter 50. One inverter delay after t4, the signal at the output of inverter 50 and the gate of P-Channel pullup transistor 12 remains at a low logic level. Since a low logic level signal continues to be driven into the gate of P-Channel pullup transistor 12, transistor 12 remains switched on one inverter delay after t4.

Two inverter delays after t4 (occurring at t5), the high logic level signal driven by output node 20 would have reached the output of inverter 30 and the first input of logic NOR circuit 32 as a high logic level signal. The signal being driven into input node 26 and the second input of logic NOR circuit 32 continues to be a low logic level signal.

During t5, logic NOR circuit 32 will switch its output signal from a high logic level to a low logic level, since a high logic level signal is being driven into its first input and a low logic level signal is being driven into its second input. Logic NOR circuit 32 will then drive its low logic level output signal into the input of inverter 50. One inverter delay after t5, the signal at the output of inverter 50 and input of P-Channel pullup transistor 12 is at a high logic level. One inverter delay after t5, P-Channel pullup transistor 12 will switch off, since a high logic level signal is driven into its gate. Therefore, feedback circuit 18 also has the function of switching off P-Channel pullup transistor 12 after the voltage at output node 20 switches to a high logic level at t4.

After P-Channel pullup transistor 12 is turned off, the voltage level of the capacitance load at output node 20 is restored to its initial state during the t0 steady state period. P-Channel leakage transistor 14 maintains the high logic level of the capacitance load, after P-Channel pullup transistor 12 is switched off by feedback circuit 18.

In feedback circuit 18, P-Channel switching transistors 46 and 48 and N-Channel inverter transistor 54 participate in the generation of the low logic level signal at the gate of P-Channel pullup transistor 12. The sizes of these transistors should be chosen to provide fast switching of driver circuitry 10. N-Channel inverter transistors 36 and 40, P-Channel inverter transistors 34, 38, and 52, and N-Channel switching transistors 42 and 44 are involved either in restoring the initial state of driver circuitry 10 or in delaying the switching of logic NOR circuit 32. Consequently, these transistors are small devices.

Figure 3:
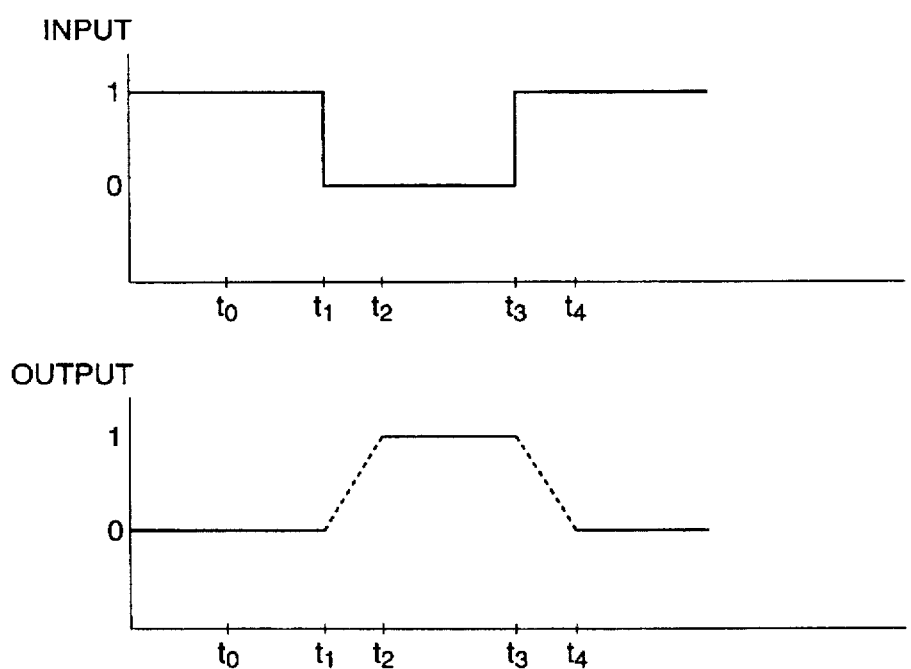
FIG. 3 is a timing diagram of the operation of the circuit of FIG. 1 upon the application of a negative-going input signal pulse.

The second condition to consider when analyzing the operation of driver circuitry 10 is when a negative-going input signal pulse is applied to input node 26. Referring now to FIG. 3, a timing diagram will be useful when analyzing the operation of driver circuit 10 when the negative-going pulse is driven into input node 26. During an initial steady state time period t0 when the input signal to input node 26 is at a high logic level, N-Channel pulldown transistor 16 is switched on, since the high logic level input signal is being driven into the gate of N-Channel pulldown transistor 16. The high logic level input signal is also being driven into the second input of logic NOR circuit 32.

Since N-Channel pulldown transistor 16 is switched on during t0, current conductance can occur from output node 20 to second supply voltage node 24 (ground in FIG. 1), via N-Channel pulldown transistor 16. At t0, current is discharged through N-Channel pulldown transistor 16 from the capacitance load at output node 20. P-Channel leakage transistor 14 is a small device and can only provide leakage current. By itself it is unable to instantaneously charge the capacitance load at output node 20 to a high logic level. In addition, it will be discussed below that P-Channel pullup transistor 12 is switched off during t0. Therefore, the voltage at output node 20 during t0 is at a low logic level.

During t0, output node 20 is driving its low logic level signal into the first input of logic NOR circuit 32, via inverters pair 28 and 30. The output signal of inverter 30 is at a low logic level at t0, since it has passed through inverters pair 28 and 30. The low logic level output of inverter 30 is being driven into the first input of logic NOR circuit 32.

Logic NOR circuit 32 has a low logic level output during t0, since a low logic level signal is being driven into its first input and a high logic level signal is being driven into its second input. Logic NOR circuit 32 will then drive its low logic level output signal into the input of inverter 50. The signal at the output of inverter 50 and input of P-Channel pullup transistor 12 is at a high logic level. Since a high logic level signal is being driven into the gate of P-Channel pullup transistor 12, transistor 12 is switched off during the t0 initial steady state period.

During a subsequent time period t1 occurring after initial steady state time period t0, a low logic level signal may be driven into input node 26 (see FIG. 3). This low logic level signal switches off N-Channel pulldown transistor 16, thereby forming an open circuit between output node 20 and second supply voltage node 24.

The low logic level signal driven into input node 26 during t1 is also driven into the second input of logic NOR circuit 32. The signal being driven into the first input of logic NOR circuit 32 remains at a low logic level during t1, since the signal driven by output node 20 into the first input of logic NOR circuit 32 is delayed by inverters pair 28 and 30.

During t1, logic NOR circuit 32 switches its output signal from a low logic level to a high logic level, since a low logic level signal is being driven into its first input and second input. Logic NOR circuit 32 will then drive its high logic level output signal into the input of inverter 50. One inverter delay after t1, the signal at the output of inverter 50 and the gate of P-Channel pullup transistor 12 is at a low logic level. Since a low logic level signal is driven into the gate of P-Channel pullup transistor 12, transistor 12 turns on at one inverter delay after t1.

After P-Channel pullup transistor 12 switches on, the capacitance load at output node 20 is rapidly charged to a high logic level by P-Channel pullup transistor 12. At a subsequent time t2, the capacitance load at output node 20 is fully charged to a high logic level.

Two inverter delays after t2, the high logic level signal driven by output node 20 would have reached the output of inverter 30 and the first input of logic NOR circuit 32 as a high logic level signal. Logic NOR circuit 32 will then switch its output from a high logic level to a low logic level, since a high logic level signal is being driven into its first input. Logic NOR circuit 32 will then drive its low logic level output signal into the input of inverter 50. One inverter delay after this time, the signal at the output of inverter 50 and the gate of P-Channel pullup transistor 12 is at a high logic level. P-Channel pullup transistor 12 will switch off since a high logic level signal is being driven into its gate. Therefore, feedback circuit 18 also has the function of switching off P-Channel pullup transistor 12 after the voltage at output node 20 switches to a high logic level at t2.

The rapid charging of the capacitance load generates the rising edge of the positive output pulse generated at output node 20. Those of ordinary skill in the art will recognize that the charging of the capacitance load can be delayed at various time periods occurring after the signal at input node 26 switches from a high logic level to a low logic level. As discussed above, the delay of the charging of the capacitance load is achieved by connecting additional inverter pairs in series with inverter 50.

At t3, the signal at input node 26 may switch from a low logic level to a high logic level (see FIG. 3). The high logic input signal switches on N-Channel pulldown transistor 16. Since N-Channel pulldown transistor 16 is switched on, current conductance can occur from output node 20 to second supply voltage node 24 (ground in FIG. 1 ), via N-Channel pulldown transistor 16. At t3, current is discharged through N-Channel pulldown transistor 16 from the capacitance load at output node 20. The capacitance load current discharge through N-Channel pulldown transistor 16 causes the voltage at output node 20 to decrease to a low logic level at a subsequent time period t4.

The capacitance load discharge generates the falling edge of the positive output pulse generated at output node 20. Those of ordinary skill in the art will recognize that the capacitance load discharge can be delayed at various time periods occurring subsequent to t3. As discussed above, the delay of the capacitance load discharge is achieved by connecting optional inverter pairs between input node 26 and the gate of N-Channel pulldown transistor 16.

During t3, logic NOR circuit 32 will switch its output signal from a high logic level to a low logic level, since a high logic level signal is being driven into its second input from input node 26. Logic NOR circuit 32 will then drive its low logic level output signal) into the input of inverter 50. One inverter delay after t3, the signal at the output of inverter 50 and input of P-Channel pullup transistor 12 is at a high logic level. Since a high logic level signal is being driven into the gate of P-Channel pullup transistor 12, transistor 12 switches off one inverter delay after t3.

One inverter delay after t3, with P-Channel pullup transistor 12 turned off and N-Channel pulldown transistor 16 turned on, the voltage level of the capacitance load at output node 20 is restored to its initial state during the t0 steady state period.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A wideband power driver having separate settings to delay a falling edge and rising edge of an output signal, comprising:

an input node;

an output node;

a pulldown circuit connected between said output node and a first supply voltage potential, said pulldown circuit having an input;

a pullup circuit connected between said output node and a second supply voltage potential, said pullup circuit having an input;

a leakage current circuit connected between said output node and the second supply voltage potential;

a NOR gate having a first input, a second input connected to said input node, and an output;

a first non-inverting delay element having an input connected to said output node and an output connected to the first input of said NOR gate;

an inverting delay element having an input connected to the output of said NOR gate and an output connected to the input of said pullup circuit, said inverting delay element selected to provide a delay of the rising edge of the output signal; and a second non-inverting delay element having an input connected to said input node and an output connected to the input of said pulldown circuit, said second noninverting delay element selected to provide a delay of the falling edge of the output signal.

2. The wideband power driver of claim 1 wherein said pulldown circuit comprises:

an N-channel pulldown transistor having a drain connected to said output node, a source connected to the first supply voltage potential, and a gate connected to said second non-inverting delay element;

and further wherein said pullup circuit comprises:

a P-Channel pullup transistor having a drain connected to said output node, a source connected to the second supply voltage potential, and a gate connected to said inverting delay element.

3. The wideband power driver of claim 2 wherein said leakage current circuit comprises a P-Channel leakage transistor having a drain connected to said output node, a source connected to the second supply voltage potential, and a gate connected to the first supply voltage potential.

4. The wideband power driver of claim 3 wherein said P-Channel leakage transistor has a channel width narrower than the respective channel widths of said P-Channel pullup transistor and said N-Channel pulldown transistor.

5. The wideband power driver of claim 1 wherein said NOR gate comprises:

a first N-Channel switching transistor having a drain connected to the input of said inverting delay element, a source connected to the first supply voltage potential, and a gate connected to said input node;

a second N-Channel switching transistor having a drain connected to the input of said inverting delay element, a source connected to the first supply voltage potential, and a gate connected to the output of said first non-inverting delay element;

a first P-Channel switching transistor having a drain connected to the input of said inverting delay element, a source, and a gate connected to said input node; and a second P-Channel switching transistor having a drain connected to the source of said first P-Channel switching transistor, a source connected to the second supply voltage potential, and a gate connected to the output of said first non-inverting delay element.

6. The wideband power driver of claim 1 wherein said first non-inverting delay element comprises an even number of first cascaded inverters connected between said output node and the first input of said NOR gate.

7. The wideband power driver of claim 1 wherein said inverting delay element comprises an odd number of second cascaded inverters connected between the output of said NOR gate and the input of said pullup circuit.

8. The wideband power driver of claim 1 wherein said second non-inverting delay element comprises an even number of third cascaded inverters connected between said input node and the input of said pulldown circuit.

9. A wideband power driver having separate settings to delay a falling edge and rising edge of an output signal, comprising:

an input node;

an output node;

an N-channel pulldown transistor having a drain connected to said output node, a source connected to a first supply voltage potential, and a gate;

a P-Channel pullup transistor having a drain connected to said output node, a source connected to a second supply voltage potential, and a gate;

a P-Channel leakage transistor having a drain connected to said output node, a source connected to the second supply voltage potential, and a gate connected to the first supply voltage potential;

a NOR gate having a first input, a second input connected to said input node, and an output;

a first non-inverting delay element having an input connected to said output node and an output connected to the first input of said NOR gate, said first non-inverting delay element including a pair of first cascaded inverters connected between the input of said first non-inverting delay element and the output of said first noninverting delay element;

an inverting delay element having an input connected to the output of said NOR gate and an output connected to the gate of said P-Channel pullup transistor, said inverting delay element selected to provide a delay of the rising edge of the output signal, said inverting delay element including an inverter connected between the input of said inverting delay element and the output of said inverting delay element; and a second non-inverting delay element having an input connected to said input node and an output connected to the gate of said N-Channel pulldown transistor, said second non-inverting delay element selected to provide a delay of the falling edge of the output signal, said second non-inverting delay element including a pair of second cascaded inverters connected between the input of said second non-inverting delay element and the output of said second non-inverting delay element.

10. A method for generating an output signal having a delayed falling edge and rising edge, comprising the steps of:

providing a circuit including:

an input node;

an output node;

a pulldown circuit connected between said output node and a first supply voltage potential, said pulldown circuit having an input;

a pullup circuit connected between said output node and a second supply voltage potential, said pullup circuit having an input;

a leakage current circuit connected between said output node and the second supply voltage potential;

a NOR gate having a first input, a second input connected to said input node, and an output;

a first non-inverting delay element having an input connected to said output node and an output connected to the first input of said NOR gate;

an inverting delay element having an input connected to the output of said NOR gate and an output connected to the input of said pullup circuit, said inverting delay element selected to provide a delay of the rising edge of the output signal;

a second non-inverting delay element having an input connected to said input node and an output connected to the input of said pulldown circuit, said second non-inverting delay element selected to provide a delay of the falling edge of the output signal; and providing an input signal pulse to said input node of said circuit so as to generate an output signal at said output node.

11. The method of claim 10 wherein said pulldown circuit comprises:
an N-channel pulldown transistor having a drain connected to said output node, a source connected to the first supply voltage potential, and a gate connected to said second non-inverting delay element;
and further wherein said pullup circuit comprises:
a P-Channel pullup transistor having a drain connected to said output node, a source connected to the second supply voltage potential, and a gate connected to said inverting delay element.

12. The method of claim 11 wherein said leakage current circuit comprises a P-Channel leakage transistor having a drain connected to said output node, a source connected to the second supply voltage potential, and a gate connected to the first supply voltage potential.

13. The method of claim 12 wherein said P-Channel leakage transistor has a channel width narrower than the respective channel widths of said P-Channel pullup transistor and said N-Channel pulldown transistor.

14. The method of claim 10 wherein said NOR gate comprises:
a first N-Channel switching transistor having a drain connected to the input of said inverting delay element, a source connected to the first supply voltage potential, and a gate connected to said input node;
a second N-Channel switching transistor having a drain connected to the input of said inverting delay element, a source connected to the first supply voltage potential, and a gate connected to the output of said first non-inverting delay element;
a first P-Channel switching transistor having a drain connected to the input of said inverting delay element, a source, and a gate connected to said input node; and
a second P-Channel switching transistor having a drain connected to the source of said first P-Channel switching transistor, a source connected to the second supply voltage potential, and a gate connected to the output of said first non-inverting delay element.

15. The method of claim 10 wherein said first non-inverting delay element comprises an even number of first cascaded inverters connected between said output node and the first input of said NOR gate.

16. The method of claim 10 wherein said inverting delay element comprises an odd number of second cascaded inverters connected between the output of said NOR gate and the input of said pullup circuit.

17. The method of claim 10 wherein said second non-inverting delay element comprises an even number of third cascaded inverters connected between said input node and the input of said pulldown circuit.

18. A method for generating an output signal having a delayed falling edge and rising edge on an output node, upon the application of a positive-going input signal pulse on an input node, comprising the steps of:
generating a first non-inverted, delayed signal in response to a rising edge of the positive-going input signal pulse;
pulling down said output node in response to said first non-inverted, delayed signal;
generating a second non-inverted, delayed signal into a first input of a NOR gate, in response to said step of pulling down said output node;
generating an non-inverted, non-delayed signal into a second input of said NOR gate, in response to a falling edge of the positive-going input signal pulse;

switching an output signal of said NOR gate in response to said second non-inverted, delayed signal and said non-inverted, non-delayed signal;
generating an inverted, delayed signal in response to said step of switching said output signal of said NOR gate; and
pulling up said output node in response to said inverted, delayed signal.

19. The method of claim 18 wherein the step of generating said first non-inverted, delayed signal includes providing an even number of first cascaded inverters to drive a pulldown switch in response to the rising edge of the positive-going input signal pulse.

20. The method of claim 18 wherein the step of generating said second non-inverted, delayed signal includes providing an even number of second cascaded inverters to drive the first input of said NOR gate in response to said step of pulling down said output node.

21. The method of claim 18 wherein the step of generating said inverted, delayed signal includes providing an odd number of second cascaded inverters to drive a pullup switch in response to said step of switching said output signal of said NOR gate.

22. A method for generating an output signal having a delayed falling edge and rising edge on an output node, upon the application of a negative-going input signal pulse on an input node, comprising the steps of:
driving a first non-inverted, delayed signal at a low logic level into a first input of a NOR gate, in response to an initial low logic level of the output node;
generating a non-inverted, non-delayed signal into a second input of said NOR gate, in response to a falling edge of the negative-going input signal pulse;
switching an output signal of said NOR gate in response to said first non-inverted, delayed signal and said non-inverted, non-delayed signal;
generating an inverted, delayed signal in response to said step of switching said output signal of said NOR gate;
putting up said output node in response to said inverted, delayed signal;
generating a second non-inverted, delayed signal in response to a rising edge of the negative-going input signal pulse; and
pulling down said output node in response to said second non-inverted, delayed signal.

23. The method of claim 22 wherein the step of driving said first non-inverted, delayed signal includes providing an even number of first cascaded inverters to drive the first input of said NOR gate, in response to an initial low logic level of the output node.

24. The method of claim 22 wherein the step of generating said inverted, delayed signal includes providing an odd number of second cascaded inverters to drive a pullup switch, in response to said step of switching said output signal of said NOR gate.

25. The method of claim 22 wherein the step of generating said second non-inverted, delayed signal includes providing an even number of third cascaded inverters to drive a pulldown switch, in response to the rising edge of the negative-going input signal pulse.

26. A wideband power driver for generating a pulse having a delayed falling edge and rising edge on an output node, upon the application of a positive-going and negative-going input signal pulse on an input node, comprising:
means for generating a first non-inverted, delayed signal in response to the input signal pulse;

means for pulling down said output node in response to the first non-inverted, delayed signal;

means for generating a second non-inverted, delayed signal into a first input of a NOR gate;

means for generating a non-inverted, non-delayed signal into a second input of said NOR gate, in response to the input signal pulse;

means for switching an output signal of said NOR gate in response to said second non-inverted, delayed signal and said non-inverted, non-delayed signal;

means for generating an inverted, delayed signal in response to said step of switching said output signal of said NOR gate; and means for pulling up said output node in response to said inverted, delayed signal.

27. The wideband power driver of claim 26 wherein said means for generating said first non-inverted, delayed signal comprises an even number of first cascaded inverters connected between said input node and said means for pulling down said output node.

28. The wideband power driver of claim 26 wherein said means for pulling down said output node comprises a pulldown switch connected to said output node, said means for generating said first non-inverted, delayed signal, and a first supply voltage potential.

29. The wideband power driver of claim 26 wherein said means for generating said second non-inverted, delayed signal comprises an even number of second cascaded inverters connected between said output node and the first input of said NOR gate.

30. The wideband power driver of claim 26 wherein said means for switching said output signal of said NOR gate comprises:

a first NOR gate switch connected to said input node, the first supply voltage potential, and said means for generating said inverted, delayed signal;

a second NOR gate switch connected to said means for generating said second non-inverted, delayed signal, said means for generating said inverted, delayed signal, and the first supply voltage potential;

a third NOR gate switch connected to said input node and said means for generating said inverted, delayed signal; and a fourth NOR gate switch connected to said means for generating said second non-inverted, delayed signal, said third NOR gate, and a second supply voltage potential.

31. The wideband power driver of claim 26 wherein said means for generating said inverted, delayed signal comprises an odd number of third cascaded inverters connected between said NOR gate and said means for pulling up said output node.

32. The wideband power driver of claim 26 wherein said means for pulling up said output node comprises a pullup switch connected to said means for generating said inverted, delayed signal, said output node, and a second supply voltage potential.

* * * * *

UNITED STATES PATENT AND TRADEMARK OFFICE
CERTIFICATE OF CORRECTION

PATENT NO. : 5,734,271
DATED : March 31, 1998
INVENTOR(S) : Gennady Ivanovich Grishakov, Igor Vladimirovich Tarasov It is certified that error appears in the above-indentified patent and that said Letters Patent is hereby corrected as shown below:

On column 1, line 10, please replace "failing" with --falling--.
On column 3, line 57 (looks lice line 58), please delete "pair".
On column 4, line 40 (looks like line 41), please delete "pair".
On column 4, line 58 (looks like line 59), please delete "pair".
On column 5, line 25, please delete "pair".
On column 6, line 3, please delete "pair".
On column 7, line 10, please delete "pair".
On column 7, line 12, please delete "pair".
On column 7, line 35, please delete "pair".
On column 8, line 31, please delete ")".
On column 9, line 9, please replace "noninverting" with --non-inverting--.
On column 10, line 19, please replace "noninverting" with --non-inverting--.
On column 12, line 39, please replace "putting" with --pulling--.

Signed and Sealed this

Twenty-eighth Day of July, 1998

*Attest:*

BRUCE LEHMAN

*Attesting Officer*  *Commissioner of Patents and Trademarks*